(12) United States Patent
Liu

(10) Patent No.: US 6,684,382 B2
(45) Date of Patent: Jan. 27, 2004

(54) MICROLOADING EFFECT CORRECTION

(75) Inventor: Hua-Yu Liu, Palo Alto, CA (US)

(73) Assignee: Numerical Technologies, Inc., Mountain View, CA (US)

( * ) Notice: Subject to any disclaimer, the term of this patent is extended or adjusted under 35 U.S.C. 154(b) by 101 days.

(21) Appl. No.: 09/945,012

(22) Filed: Aug. 31, 2001

(65) Prior Publication Data

US 2003/0046653 A1 Mar. 6, 2003

(51) Int. Cl.⁷ ............................................. G06F 17/50
(52) U.S. Cl. ........................................................ 716/19
(58) Field of Search ........................................... 716/19

(56) References Cited

U.S. PATENT DOCUMENTS

| | | | |
|---|---|---|---|
| 4,037,918 A | 7/1977 | Kato | 350/3.5 |
| 4,231,811 A | 11/1980 | Somekh et al. | 148/1.5 |
| 4,426,584 A | 1/1984 | Bohlen et al. | 250/492.2 |
| 4,456,371 A | 6/1984 | Lin | 355/71 |
| 4,812,962 A | 3/1989 | Witt | 364/490 |
| 4,895,780 A | 1/1990 | Nissan-Cohen et al. | 430/5 |
| 4,902,899 A | 2/1990 | Lin et al. | 250/492.1 |
| 5,051,598 A | 9/1991 | Ashton et al. | 250/492.2 |
| 5,182,718 A | 1/1993 | Harafuji et al. | 364/490 |
| 5,208,124 A | 5/1993 | Sporon-Fiedler et al. | 430/5 |
| 5,241,185 A | 8/1993 | Meiri et al. | 250/492.2 |
| 5,242,770 A | 9/1993 | Chen et al. | 430/5 |
| 5,256,505 A | 10/1993 | Chen et al. | 430/5 |
| 5,302,477 A | 4/1994 | Dao et al. | 430/5 |
| 5,308,741 A | 5/1994 | Kemp | 430/312 |
| 5,316,878 A | 5/1994 | Saito et al. | 430/5 |
| 5,324,600 A | 6/1994 | Jinbo et al. | 430/5 |
| 5,328,807 A | 7/1994 | Tanaka et al. | 430/311 |
| 5,334,542 A | 8/1994 | Saito et al. | 437/40 |
| 5,340,700 A | 8/1994 | Chen et al. | 430/312 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,447,810 A | 9/1995 | Chen et al. | 430/5 |
| 5,480,746 A | 1/1996 | Jinbo et al. | 430/5 |
| 5,496,666 A | 3/1996 | Chu et al. | 430/5 |
| 5,498,579 A | 3/1996 | Borodovsky et al. | 437/250 |
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |

(List continued on next page.)

FOREIGN PATENT DOCUMENTS

| | | |
|---|---|---|
| DE | 195 45 163 A1 | 6/1996 |
| EP | 0 464 492 A1 | 1/1992 |
| EP | 0 653 679 A2 | 5/1995 |

(List continued on next page.)

OTHER PUBLICATIONS

Balasinski et al.; "A Novel Approach To Simulate The Effect of Optical Proximity On MOSFET Parametric Yield"; 1999 IEEE; pp. 37.6.1–37.6.4.

(List continued on next page.)

*Primary Examiner*—John F. Niebling
*Assistant Examiner*—Stacy Whitmore
(74) *Attorney, Agent, or Firm*—Bever Hoffman & Harms, LLP; Jeanette S. Harms

(57) ABSTRACT

A method and apparatus for providing correction for microloading effects is described. Hybrid proximity correction techniques are used to make the problem computationally more feasible. More specifically, feature edges in a layout can be grouped into those edges, or edge segments, with a large edge separation (group B), e.g. greater than n, and those having less than that separation (group A). The group B features can then be corrected for microloading effects rapidly using rules based correction. Then both groups of edges can be corrected using model based optical proximity correction using the output of the rule based correction as the ideal, or reference, layout.

16 Claims, 6 Drawing Sheets

U.S. PATENT DOCUMENTS

| | | | |
|---|---|---|---|
| 5,537,648 A | 7/1996 | Liebmann et al. | 395/500 |
| 5,538,815 A | 7/1996 | Oi et al. | 430/5 |
| 5,539,568 A | 7/1996 | Lin et al. | 359/285 |
| 5,553,273 A | 9/1996 | Liebmann | 395/500 |
| 5,553,274 A | 9/1996 | Liebmann | 395/500 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,631,110 A | 5/1997 | Shioiri et al. | 430/5 |
| 5,635,316 A | 6/1997 | Dao | 430/5 |
| 5,636,002 A | 6/1997 | Garofalo | 355/53 |
| 5,636,131 A | 6/1997 | Liebmann et al. | 364/490 |
| 5,657,235 A | 8/1997 | Liebmann et al. | 364/474.24 |
| 5,663,017 A | 9/1997 | Schinella et al. | 430/5 |
| 5,663,893 A | 9/1997 | Wampler et al. | 364/491 |
| 5,682,323 A | 10/1997 | Pasch et al. | 364/491 |
| 5,702,848 A | 12/1997 | Spence | 430/5 |
| 5,705,301 A | 1/1998 | Garza et al. | 430/5 |
| 5,707,765 A | 1/1998 | Chen | 430/5 |
| 5,723,233 A | 3/1998 | Garza et al. | 430/5 |
| 5,725,969 A | 3/1998 | Lee | 430/5 |
| 5,740,068 A | 4/1998 | Liebmann et al. | 364/489 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,815,685 A | 9/1998 | Kamon | 395/500 |
| 5,821,014 A | 10/1998 | Chen et al. | 430/5 |
| 5,825,647 A | 10/1998 | Tsudaka | 364/167.03 |
| 5,827,623 A | 10/1998 | Ishida et al. | 430/5 |
| 5,847,959 A | 12/1998 | Veneklasen et al. | 364/468.28 |
| 5,858,580 A | 1/1999 | Wang et al. | 430/5 |
| 5,862,058 A | 1/1999 | Samuels et al. | 364/491 |
| 5,863,682 A | 1/1999 | Abe et al. | 430/30 |
| 5,879,844 A | 3/1999 | Yamamoto et al. | 430/30 |
| 5,885,734 A | 3/1999 | Pierrat et al. | 430/5 |
| 5,900,338 A | 5/1999 | Garza et al. | 430/5 |
| 5,923,566 A | 7/1999 | Galan et al. | 364/489 |
| 5,958,635 A | 9/1999 | Reich et al. | 430/30 |
| 5,972,541 A | 10/1999 | Sugasawara et al. | 430/5 |
| 5,991,006 A | 11/1999 | Tsudaka | |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,007,310 A | 12/1999 | Jacobsen et al. | 417/362 |
| 6,010,807 A | 1/2000 | Lin | 430/5 |
| 6,014,456 A | 1/2000 | Tsudaka | 382/144 |
| 6,057,063 A | 5/2000 | Liebmann et al. | 430/5 |
| 6,066,180 A | 5/2000 | Kim et al. | 716/19 |
| 6,077,310 A | 6/2000 | Yamamoto et al. | 716/19 |
| 6,077,630 A | 6/2000 | Pierrat | 430/5 |
| 6,078,738 A | 6/2000 | Garza et al. | 395/500.22 |
| 6,081,658 A | 6/2000 | Rieger et al. | 395/500.22 |
| 6,083,275 A | 7/2000 | Heng et al. | 716/19 |
| 6,114,071 A | 9/2000 | Chen et al. | 430/5 |
| 6,154,563 A | 11/2000 | Tsudaka | 382/144 |
| 6,228,539 B1 | 5/2001 | Wang et al. | 430/5 |
| 6,243,855 B1 | 6/2001 | Kobayashi et al. | |
| 6,249,597 B1 | 6/2001 | Tsudaka | 382/144 |
| 6,251,549 B1 | 6/2001 | Levenson | 430/11 |
| 6,258,493 B1 | 7/2001 | Wang et al. | 430/5 |
| 6,289,499 B1 | 9/2001 | Rieger et al. | 716/21 |
| 6,298,473 B1 | 10/2001 | Ono et al. | 716/21 |
| 6,370,679 B1 * | 4/2002 | Chang et al. | 716/19 |
| 6,453,457 B1 | 9/2002 | Pierrat et al. | 716/19 |
| 6,543,457 B2 | 4/2003 | Maiwald et al. | 716/19 |
| 2002/0100004 A1 | 7/2002 | Pierrat et al. | 716/5 |

FOREIGN PATENT DOCUMENTS

| | | |
|---|---|---|
| EP | 0 698 821 | 2/1996 |
| GB | 2324169 A | 10/1998 |
| JP | 62067547 | 3/1987 |
| JP | 7-111528 | 2/1991 |
| JP | 3-80525 | 4/1991 |
| JP | 3-210560 | 9/1991 |
| JP | 6-67403 | 3/1994 |
| JP | 8-51068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 99/47981 | 9/1999 |
| WO | WO 00/67074 | 11/2000 |

OTHER PUBLICATIONS

Hayashida et al.; "A Novel Method For Improving The Defocus Tolerance In Step And Repeat Photolithography"; SPIE vol. 772 Optical Microlithography VI (1987); pp. 66–71.

Chuang et al.; "Practical Applications Of 2–D Optical Proximity Corrections For Enhanced Performance Of 0.25 um Random Logic Devices"; 1997 IEEE; pp. 18.7.1–18.7.4.

Cobb, N., et al., "Fast, Low–Complexity Mask Design", SPIE, vol. 2440, pp. 313–327, Feb. 22–24, 1995.

Cobb, N., et al., "Experimental Results on Optical Proximity Correction With Variable Threshold Resist Model", SPIE, vol. 3051, pp. 458–468, Mar. 12–14, 1997.

Cobb, N., "Fast Optical and Process Proximity Correction Algorithms for Integrated Circuit Manufacturing", Dissertation, University of California at Berkeley, UMI Microform 9902038 (139 pages).

Toublan, O., et al., "Phase Aware Proximity Correction for Advanced Masks", SPIE, vol. 4000, pp. 160–170, Mar. 1–3, 2000.

Schmidt, R., et al., "Impact of Coma on CD Control for Multiphase PSM Designs", AMD, ASML (11 pages).

Lucas, K., et al., "Model Based OPC for 1 st Generation 193nm Lithography", Motorola Inc., IDT assignee to IMEC (12 pages).

Stirniman, J., et al., "Quantifying Proximity and Related Effects in Advanced Wafer Processes", Precim Compnay, Hewlett Packard Labs (9 pages).

Sugawara, M., et al., "Practical Evaluation of Optical Proximity Effect Correction by EDM Methodology", Sony Corporation (11 pages).

Granik, Y., et al., "MEEF as a Matrix", Mentor Graphics Corporation (11 pages).

Kang, D., et al., "Effects of Mask Bias on t he Mask Error Enhancement Factor (MEEF) of Contact Holes" (11 pages).

Matsuura, S., et al., "Reduction of Mask Error Enhancement Factor (MEEF) by the Optimum Exposure Dose Self–Adjusted Mask", NEC Corporation (12 pages).

Erdmann, A., "Topography Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative Importance of the Building Blocks for 193nm Optical Lithography", Linnovation, Inc. (12 pages).

Ackmann, P., et al., "Phase Shifting and Optical Proximity Corrections to Improve CD Control on Logic Devices in Manufacturing for Sub 0.35 um I–Line", Advance Micro Devices (8 pages).

Chen, J.F., et al., "Optical Proximity Correction for Intermediate–Pitch Features Using Sub–Resolution Scattering Bars", MicroUnity Systems Engineering, Inc., Sunnyvale, California, pp. 1–16.

Chen, J.F., et al., "Practical Method for Full–Chip Optical Proximity Correction", MicroUnity Systems Engineering, Inc., Sunnyvale, California (14 pages).

Cobb, et al., "Fast Sparse Aerial Image Calculation for OPC", SPIE, vol. 2621, pp. 534–544.

Lithas, "Lithas: Optical Proximity Correction Software" (2 pages).

Matsuoka, K., et al., "Application of Alternating Phase–Shifting Mask to 0.16um CMOS Logic Gate Patterns", Matsushita Electric Ind. Co., Ltd. (9 pages).

Microunity, "OPC Technology & Product Description", MicroUnity Systems Engineering, Inc., pp. 1–5.

Precim, "Proxima System", Precim Company, Portland, Oregon (2 pages).

Precim, "Proxima Wafer Proximity Correction System", Precim Company, Portland, Oregon (2 pages).

Rieger, M., et al., "Mask Fabrication Rules for Proximity-Corrected Patterns", Precim Company, Portland, Oregon (10 pages).

Rieger, M., et al., "Using Behavior Modeling for Proximity Correction", Precim Company, Portland, Oregon (6 pages).

Spence, C., et al., "Detection of 60(degree) Phase Defects on Alternating PSMs", Advanced Micro Devices, KLA–Tencor, DuPont RTC (2 pages).

Sugawara, M., et al., "Defect Printability Study of Attenuated Phase–Shifting Masks for Specifying Inspection Sensitivity", Sony Corporation, Kanagawa, Japan (16 pages).

Choi, Y., et al., "Optical Proximity Correction on Attenuated Phase Shifting Photo Mask for Dense Contact Array", LG Semicon Company (11 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, ARCH Chemicals, Finle Technologies, KLA Tencor Corp. (10 pages).

Ronse, K., et al., "Thin Film Interference Effects in Phase Shifting Masks Causing Phase and Transmittance Errors", IMEC (15 pages).

Rosenbluth, A., et al., "Optimum Mask and Source Patterns to Print a Given Shape", IBM (17 pages).

Sakata, M., et al., "A Novel Radiaion Sensitive Spin–on–Glass Convertible into SiO2 and the Simple Fabrication Process Using It", Oki Electric Industry Co. Ltd. (3 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1=–.3 Lithography", Canon Inc. (13 pages).

Vandenberghe, G., et al., "(Sub–) 100nm Gate Patterning Using 248nm Alternating PSM", IMEC, Mentor Graphics (9 pages).

Fritze, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Trans Vector, "Now Better Quality Photomasks", Trans Vector Technologies, Inc., Camarillo, California (4 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Saleh, B., et al., "Reduction of Errors of Microphotographic Reproductions by Optimal Corrections of Original Masks", Optical Engineering, vol. 20, No. 5, pp. 781–784, Sep./Oct. 1981.

Levenson, M., et al., "Improving Resolution in Photolithography with a Phase–Shifting Mask", IEEE, Transactions On Electron Devices, vol. ED–29, No. 12, pp. 1828–1836, Dec. 1982.

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

IBM, "Method to Produce Sizes in Openings in Photo Images Smaller Than Lithographic Minimum Size", IBM Technical Disclosure Bulletin, vol. 29, No. 3, p. 1328, Aug. 1986.

Terasawa, T., et al., "0.3–Micron Optical Lithography Using a Phase–Shifting Mask", SPIE, Optical/Laser Microlithography II, vol. 1088, pp. 25–33, Mar. 1989.

Buraschi, M., et al., "Optical–Diffraction–Based Modulation of Photoresist Profile or Microlithography Applications", Optical Engineering, vol. 28, No. 6, pp. 654–658, Jun. 1989.

Nitayama, A., et al., "New Phase Shifting Mask with Self-Aligned Phase Sifters for a Quarter Micron Photolithography", IEDM, pp. 3.3.1–3.3.4, Dec. 3–6, 1989.

Jinbo, H., et al., "0.2um or Less i–Line Lithography by Phase–Shifting–Mask Technology", IEEE, pp. 33.3.1–33.3.4 (1990).

Lin, B.J., "Methods to Print Optical Images at Low–k1 Factors", SPIE, Optical/Laser Microlithography III, vol. 1264, pp. 2–13.

Neureuther, A., "Modeling Phase Shifting Masks", SPIE, 10th Annual Symposium On Microlithography, vol. 1496, pp. 80–85 (1990).

Toh, K., et al., "Chromeless Phase–Shifted Masks: A New Approach to Phase–Shifting Masks", BACUS—Tenth Annual Symposium on Microlithography, Sep. 1990 (27 pages).

Yamanaka, T., et al., "A 5.9um2 Super Low Power SRAM Cell Using a New Phase–Shift Lithography", IEDM, pp. 18.3.1–18.3.4 (1990).

Nakagawa, K., et al., "Fabrication of 64m DRAM with I–Line Phase–Shift Lithography", IEDM, pp. 33.1.1–33.1.4 (1990).

Watanabe, H., et al., "Transparent Phase Shifting Mask", IEDM, pp. 33.2.1–33.2.4 (1990).

Inokuchi, K., et al., "Sub–Quarter Micron Gate Fabrication Process Using Phase–Shifting–Mask for Microwave GaAs Devices", Extended Abstracts Of The 1991 Intl. Conference On Solid State Devices And Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821, Dec. 1991.

Jinbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Fu, C.C., et al., "Enhancement of Lithographic Patterns by Using Serif Features", IEEE, Transactions On Electron Devices, vol. 38, No. 12, pp. 2599–2603, Dec. 1991.

Burggraaf, P., "Four More Significant Japanese Advances in Phase Shifting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Asai, S., et al., "High Performance Optical Lithography Using a Separated Light Source", J. Vac. Sci. Technol. B, vol. 10, No. 6, pp. 3023–3026, Nov./Dec. 1992.

Jinbo, H., et al., "Application of Blind Method to Phase–Shifting Lithography", IEEE, 1992 Symposium On VLSI Technology Digest Of Technical Papers, pp. 112–113 (1992).

Ohtsuka, H., et al., "Phase Defect Repair Method for Alternating Phase Shift Masks Conjugate Twin–Shifter Method", Jpn. J. Appl. Phys., vol. 31, pp. 4143–4149 (1992).

Pierrat, C., et al., "Phase–Shifting Mask Topography Effects on Lithographic Image Quality", IEEE, pp. 3.3.1–3.3.4 (1992).

Watanabe, H., et al., "Detection and Printability of Shifter Defects in Phase–Shifting Masks II Defocus Characteristics", Jpn. J. Appl. Phys., vol. 31, pp. 4155–4160 (1992).

Burggraaf, P., "Lithography's Leading Edge, Part I: Phase–Shift Technology and Part 2: I–Line and Beyond", Semiconductor International, pp. 43–47 and 52–56, Feb. 1992.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229–235 (1992).

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Brunner, T., et al., "170nm Gates Fabricated by Phase–Shift Mask and Top Anti–Reflector Process", SPIE, Optical/Laser Microlithography VI, vol. 1927, pp. 182–189 (1993).

Brunner, T., "Rim Phase–Shift Mask Combined with Off–Axis Illumination: A Path to 0.5(lampda)/Numerical Aperture Geometries", Optical Engineering, vol. 32, No. 10, pp. 2337–2343, Oct. 1993.

Garofalo, J., et al., "Mask Assisted Off–Axis Illumination Technique for Random Logic", J. Vac. Sci. Technol. B, vol. 11, No. 6, pp. 2651–2658, Nov./Dec. 1993.

Harafuji, K., et al., "A Novel Hierarchical Approach for Proximity Effect Correction in Electron Beam Lithography", IEEE, vol. 12, No. 10, pp. 1508–1514, Oct. 1993.

Lin, B.J., "Phase–Shifting Masks Gain an Edge", IEEE Circuits & Devices, pp. 28–35, Mar. 1993.

Liu, H.Y., et al., "Fabrication of 0.1um T–Shaped Gates by Phase–Shifting Optical Lithography", SPIE, Optical/Laser Microlithography VI, vol. 1927, pp. 42–52 (1993).

Nistler, J., et al., "Phase Shift Mask Defect Printability Analysis", Proceedings Of The Microlithography Seminar INTERFACE '93, OCG Microelectronic Materials, Inc., pp. 11–28 (1993).

Rieger, M., et al., "System for Lithography Proximity Compensation", Precim Company, Portland, Oregon, Sep. 1993 (28 pages).

Ronse, K., et al., "Comparison of Various Phase Shift Strategies and Applications to 0.35um ASIC Designs", SPIE—Optical/Laser Microlithography VI, vol. 1927, pp. 2–16 (1993).

Troccolo, P., et al., "Interferometric Measurement of Etch Depths in Phase Shift Masks", BACUS News, vol. 9, Issue 6, pp. 1 & 4–6, Jun. 1993.

Watanabe, H., et al., "Phase–Shifting Lithography: Mask-making and its Application", J. Vac. Sci. Technol. B, vol. 11, No. 6, pp. 2669–2674, Nov./Dec. 1993.

Galan, G., et al., "Application of Alternating–Type Phase Shift Mask to Polysilicon Level for Random Logic Circuits", Jpn. J. Appl. Phys., vol. 33, pp. 6779–6784 (1994).

Garofalo, J., et al., "Automatic Proximity Correction for 0.35um I–Line Photolithography", IEEE, pp. 92–94 (1994).

Mizuno, F., et al., "Practical Phase–Shifting Mask Technology for 0.3um Large Scale Integrations", J. Vac. Sci. Technol. B, vol. 12, No. 6, pp. 3799–3803, Nov./Dec. 1994.

Nistler, J., et al., "Large Area Optical Design Rule Checker for Logic PSM Application", SPIE, Photomask And X–Ray Mask Technology, vol. 2254, pp. 78–92 (1994).

Pati, Y.C., et al., "Phase–Shifting Masks for Microlithography: Automated Design and Mask Requirements", J. Opt. Soc. Am., vol. 11, No. 9, pp. 2438–2452, Sep. 1994.

Pierrat, C., et al., "A Rule–Based Approach to E–Beam and Process–Induced Proximity Effect Correction for Phase–Shifting Mask Fabrication", SPIE, vol. 2194, pp. 298–309 (1994).

Spence, C., et al., "Automated Determination of CAD Layout Failures Through Focus: Experiment and Simulation", SPIE, vol. 2197, pp. 302–313 (1994).

Stirniman, J., et al., "Fast Proximity Correction with Zone Sampling", vol. 2197, pp. 294–301 (1994).

Stirniman, J., et al., "Optimizing Proximity Correction for Wafer Fabrication Processes", SPIE, Photomask Technology And Management, vol. 2322, pp. 239–246 (1994).

Stirniman, J., et al., "Wafer Proximity Correction and Its Impact on Mask–Making", Bacus News, vol. 10, Issue 1, pp. 1, 3–7, 10–12, Jan. 1994.

Henderson, R., et al., "Optical Proximity Effect Correction: An Emerging Technology", Microlithography World, pp. 6–12 (1994).

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE, vol. 2440, pp. 192–206, Feb. 1995.

Garofalo, J., et al., "Automated Layout of Mask Assist–Features for Realizing 0.5k1 ASIC Lithography", SPIE, vol. 2440, pp. 302–312 (1995).

Karklin, L., "A Comprehensive Simulation Study of the Photomask Defects Printability", SPIE, vol. 2621, pp. 490–504 (1995).

Langston, J., et al., "Extending Optical Lithography to 0.25um and Below", Solid State Technology, pp. 57–64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Rieger, M., et al., "Customizing Proximity Correction for Process–Specific Objectives", SPIE, vol. 2726, pp. 651–659 (1996).

Yen, A., et al., "Characterization and Correction of Optical Proximity Effects in Deep–Ultraviolet Lithography Using Behavior Modeling", J. Vac. Sci. Technol. B, vol. 14, No. 6, pp. 4175–4178, Nov./Dec. 1996.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Chen, J.F., et al., "Full–Chip Optical Proximity Correction with Depth of Focus Enhancement", Microlithography World (1997).

Ishiwata, N., et al., "Novel Alternating Phase Shift Mask with Improved Phase Accuracy", SPIE, Proceedings Of The 17th Annual Symposium On Photomask Technology And Management, vol.3236, pp. 243–249 (1997).

Morimoto, H., et al., "Next Generation Mask Strategy—Technologies are Ready for Mass Production of 256MDRAM?", SPIE, vol. 3236, pp. 188–189 (1997).

Park, C., et al., "An Automatic Gate CD Control for a Full Chip Scale SRAM Device", SPIE, vol. 3236, pp. 350–357 (1997).

Roman, B., et al., "Implications of Device Processing on Photomask CD Requirements", SPIE, vol. 3236 (1997) (Abstract Only).

Dolainsky, C., et al., "Application of a Simple Resist Model to Fast Optical Proximity Correction", SPIE, vol. 3051, pp. 774–780 (1997).

Chen, J., et al., "Full–Chip Optical Proximity Correction with Depth of Focus Enhancement", Microlithography World ,(5 pages) (1997).

Ishida, S., et al., "Large Assist Feature Phase–Shift Mask for Sub–Quarter Micrometer Window Pattern Formation", SPIE, vol. 3096, pp. 333–343 (1997).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subpeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Asai, N., et al., "Proposal for the Coma Aberration Dependent Overlay Error Compensation Technology", Jpn. J. Appl. Phys., vol. 37, pp. 6718–6722 (1998).

Gotoh, Y., et al., "Pattern Dependent Alignment Technique for Mix–and–Match Electron–Beam Lithography with Optical Lithography", J. Vac. Sci. Technol. B, vol. 16, No. 6, pp. 3202–3205, Nov./Dec. 1998.

Wong, A., et al., "Lithographic Effects of Mask Critical Dimension Error", SPIE, vol. 3334, pp. 106–115 (1998).

Gordon, R., et al., "Design and Analysis of Manufacturable Alternating Phase–Shifting Masks", Bacus News, vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Petersen, J., et al., "Designing Dual–Trench Alternating Phase–Shift Masks for 140nm and Smaller Features Using 248–nm KrF and 193–nm ArF Lithography", Bacus News, vol. 14, Issue 8, pp. 1 & 4–13, Aug. 1998.

Fukuda, H., et al., "Determination of High–Order Lens Aberration Using Phase/Amplitude Linear Algebra", J. Vac. Sci. Technol. B, vol. 17, No. 6, pp. 3318–3321, Nov./Dec. 1999.

Fukuda, H., "Node–Connection/Quantum Phase–Shifting Mask: Path to Below 0.3um Pitch, Proximity Effect Free, Random Interconnects and Memory Patterning", J. Vac. Sci. Technol. B, vol. 17, No. 6, pp. 3291–3295, Nov./Dec. 1999.

Spence, C., et al., "Integration of Optical Proximity Correction Strategies in Strong Phase Shifters Design for Poly–Gate Layers", Bacus News, vol. 15, Issue 12, pp. 1, 4–13, Dec. 1999.

Balasinski, A., et al., "Comparison of Mask Writing Tools and Mask Simulations for 0.16um Devices", IEEE, SEMI Advanced Semiconductor Manufacturing Conference, pp. 372–377 (1999).

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th International Conference on Electron, Ion and Photon Beam Technology and Nanofabrication Abstracts, pp. 18–19, May 30–Jun.

Pierrat, C., "Investigation of Proximity Effects in Alternating Aperture Phase Shifting Masks", Numerical Technologies, Inc. (11 pages).

Wong, A., et al., "Asymmetric Biasing for Subgrid Pattern Adjustment", SPIE, vol. 4346, pp. 1–6 (2001).

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

* cited by examiner

MICROLOADING EFFECT CORRECTION

BACKGROUND

1. Field of the Invention

This invention relates to the field of semiconductor devices. More particularly, the invention relates to a method and apparatus for correcting for microloading effects.

2. Description of the Related Art

One common step in modern approaches to integrated circuit (IC) production is the use of an etching process after exposure of photoresist on the semiconductor to electromagnetic radiation (e.g. light).

There are number of different etching technologies and methods available including, plasma etching and several types of ion beam etching. In some instances over etching, e.g. etching for an extended period of time compared to the normal etching period, has been used to reduce feature sizes. However, over etching worsens the microloading effect.

Of particular importance during etching processes is maintaining uniformity. Uniformity refers to evenness of etching for critical dimension, as well as uniformity of etching across a wafer and from wafer to wafer. At the microscopic level, etching rates and profiles depend on features size and feature separation. Microscopic uniformity problems can be grouped into several categories including pattern-dependent etch effects, generally referred to as a microloading. More specifically, microloading refers to the dependence of the etch rate on feature separation for identically sized features and it results from the depletion of reactants when the wafer has a local, higher-density area.

From a terminology standpoint, critical dimension simply refers to the dimension (e.g. width) of a feature in the relevant direction. For example, a feature corresponding to a transistor can be conceived of as a one dimensional object on the mask since the length will change, but the critical dimension will not. Thus, for example if the transistors are being prepared with a target critical dimension of 1 $\mu$m, there can be multiple transistors with different lengths, e.g. some 5 $\mu$m, some shorter, some longer, but all might be designed to have critical dimension of 1 $\mu$m. (Note, a single mask may include similar features having different critical dimensions.)

Current optical proximity correction techniques are not well suited to accounting for microloading effects. Further, if existing approaches are used in a straightforward fashion they may be computationally infeasible with present day computer systems and hardware.

Accordingly, what is needed is a method and apparatus for correcting for microloading effects. Also suitable masks for producing integrated circuits that have been corrected for microloading effects. (As used herein, the term masks includes reticles.)

SUMMARY

A method and apparatus for providing correction for microloading effects is described. Hybrid proximity correction techniques are used to make the problem computationally more feasible. Specifically, if model based optical proximity correction techniques were used alone, the problem would be extremely complicated and further changes made to correct for optical errors would interact with changes made to correct microloading errors.

The approach groups feature edges in a layout into those edges, edges or edge segments, with a large edge separation (group B), e.g. greater than n, and those having less than that separation (group A). More specifically, the straight line distance from neighboring edges to a given edge can be determined and edges, or edge segments, that are further than the given amount n placed into group B. The value of n is process technology dependent, for an example $\lambda$=248 nm wavelength process, n=1.5 $\mu$m. Edges having a separation equal to n are placed into either group A or group B, in one embodiment they are placed in group B to be corrected for microloading effects.

The group B features are then corrected for microloading effects, or etch effects, using rules based correction. Rules based corrections can be applied extremely rapidly since there is minimal computational complexity as the layout is scanned for features, edges, and/or edge segments matching the rule criteria and then the rules are applied. For example, a rule might adjust an edge with a separation of 2.0 $\mu$m by 30 nm.

Next, both groups of edges, e.g. the entire layout portion being corrected, can be corrected using model based optical proximity correction (MOPC). The MOPC is applied using the output of the rule based correction as the ideal, or reference layout. Conceptually this can be viewed as the MOPC is trying to bring the layout so that after optical effects occur the pattern will be such that it is shaped as was computed is better (based on the rules) to account for the later occurring etch process.

In some embodiments, the ordering of the etch and optical effects are switched; however, such embodiments are likely to give less accurate corrections, but may still be useful. Approaches for developing appropriate etch and optical models are described as well. The models can be generated using measurements taken from test exposures. This ensures that the generated models are calibrated for the particular lithography process being used including the stepper, the resist, the etch, etc. In some embodiments, uncalibrated models are used based on assumed data or theoretical computations. This may be appropriate for testing purposes, if suitable test exposures cannot be obtained, and/or if only slight changes to the lithography process for a previously calibrated model are being made, etc.

DETAILED DESCRIPTION

Overview

As noted, uniformity of critical dimension (CD) of features is an important aspect of etching processes. In order to maintain uniformity of CD, microloading effects should be considered. An approach to correcting for microloading effects to provide uniformity of critical dimension will be discussed first. Next, a more detailed setup of the parameters and models used will be considered. Finally several alternative embodiments will be considered.

Efficient Microloading Effect Correction

Figure 1:
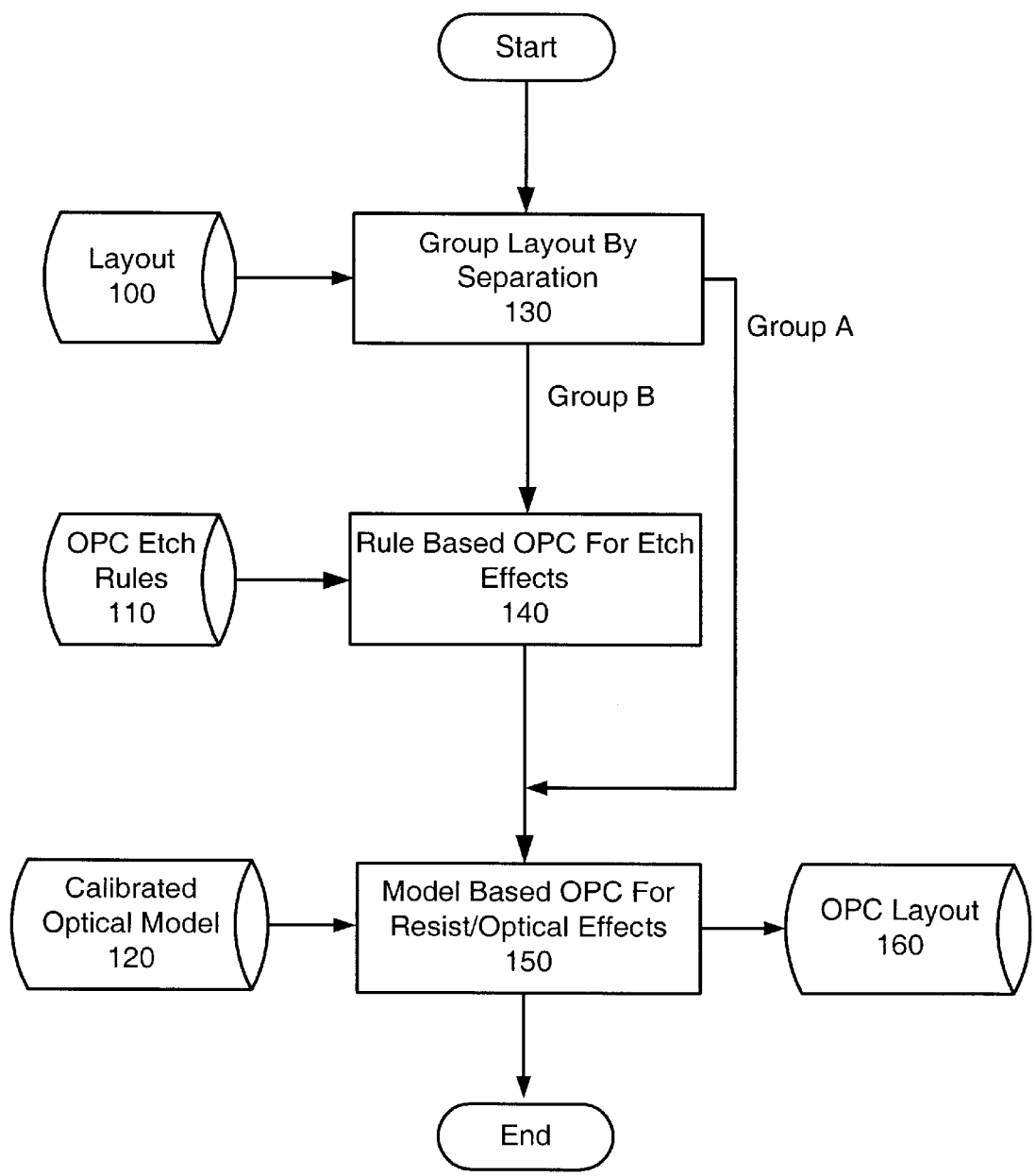
FIG. 1 is a process flow diagram for performing optical proximity correction (OPC) on a layout in a manner that corrects for microloading effects.

FIG. 1 is a process flow diagram for performing optical proximity correction (OPC) on a layout in a manner that corrects for microloading effects. The process of FIG. 1 is best understood in conjunction with the respective processes described on FIGS. 5 and 6 and the example shown in FIGS. 2–4.

The process starts at step 130 when edge segments of features from a layout 100 are divided into two groups (group A and group B) based on their separation from one another. Group A will be comprised of relatively densely packed edge segments (e.g. separation<n μm), while group B will be comprised of semi-isolated and isolated edge segments (e.g. separation>n μm). (Note: Edge segments with a separation=n μm can be placed in either group A or group B. In one embodiment they are placed in group B to ensure correction for microloading effects.)

In this example, the separation used is 1.5 μm for a sample λ=248 nm process. More generally, the separation n should be larger than the range of optical proximity effects for the particular process and based on the observed range of microloading/etch effects for the process.

Figure 2:
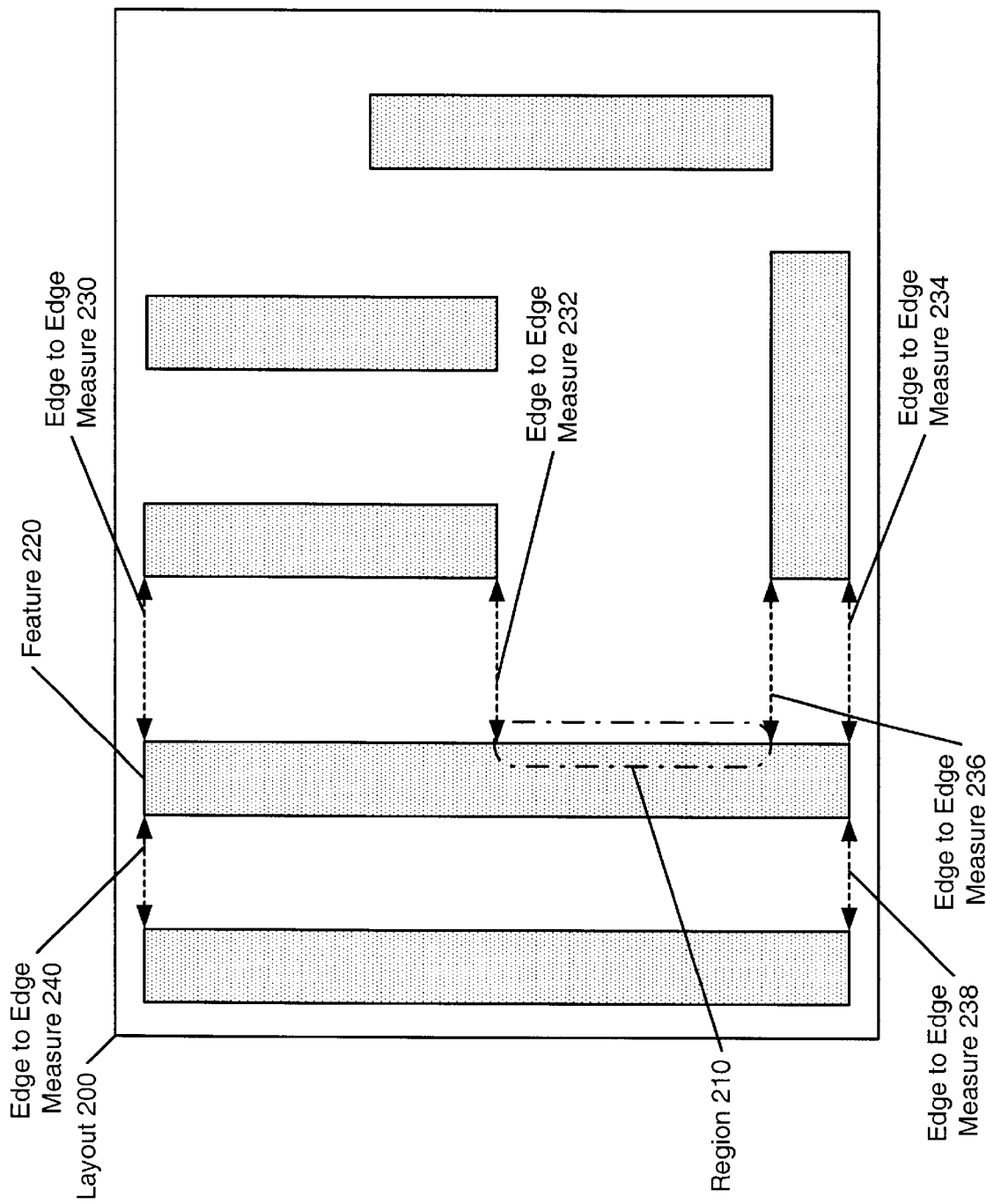
FIG. 2 is a layout for a portion of an integrated circuit.

Different edges, and even portions of a single edge, of a feature in a layout may have different characteristics vis-à-vis their relative isolation from other features. FIG. 2 shows an exemplary layout 200 including a number of features. The grouping of edges for the feature 220 in the layout 200 will be considered. One approach is to measure the line from the corner of other layout objects toward edges of the feature 220 (the measurement line should be perpendicular to the orientation of the edge). Six measurement lines are shown as dashed lines with arrowheads. The edge to edge measure 230 shows the distance between the top corner of a nearby feature and one point on the right edge of feature 220. Further down the edge 220 another edge to edge measure 232 intersects the right edge of the feature 220. Still further down, the edge to edge measures 232, 234 and 236 intersect the feature 220 along the right edge. Note however, that the region 210 between the edge to edge measure 232 and the edge to edge measure 236 is actually >n μm (here, n=1.5 μm) from other edges. Thus the region 210 of the right edge of the feature 220 will fall into group B. The distance between the left edge of the feature 220 and nearby features is shown by edge to edge measures 238 and 240. In contrast, the other portions of the side edges of the feature 220 are <1.5 μm from nearby edges and would fall into group A. The grouping can be done in parallel or series for the other layout features being corrected for microloading effects and optical proximity effects.

Figure 3:
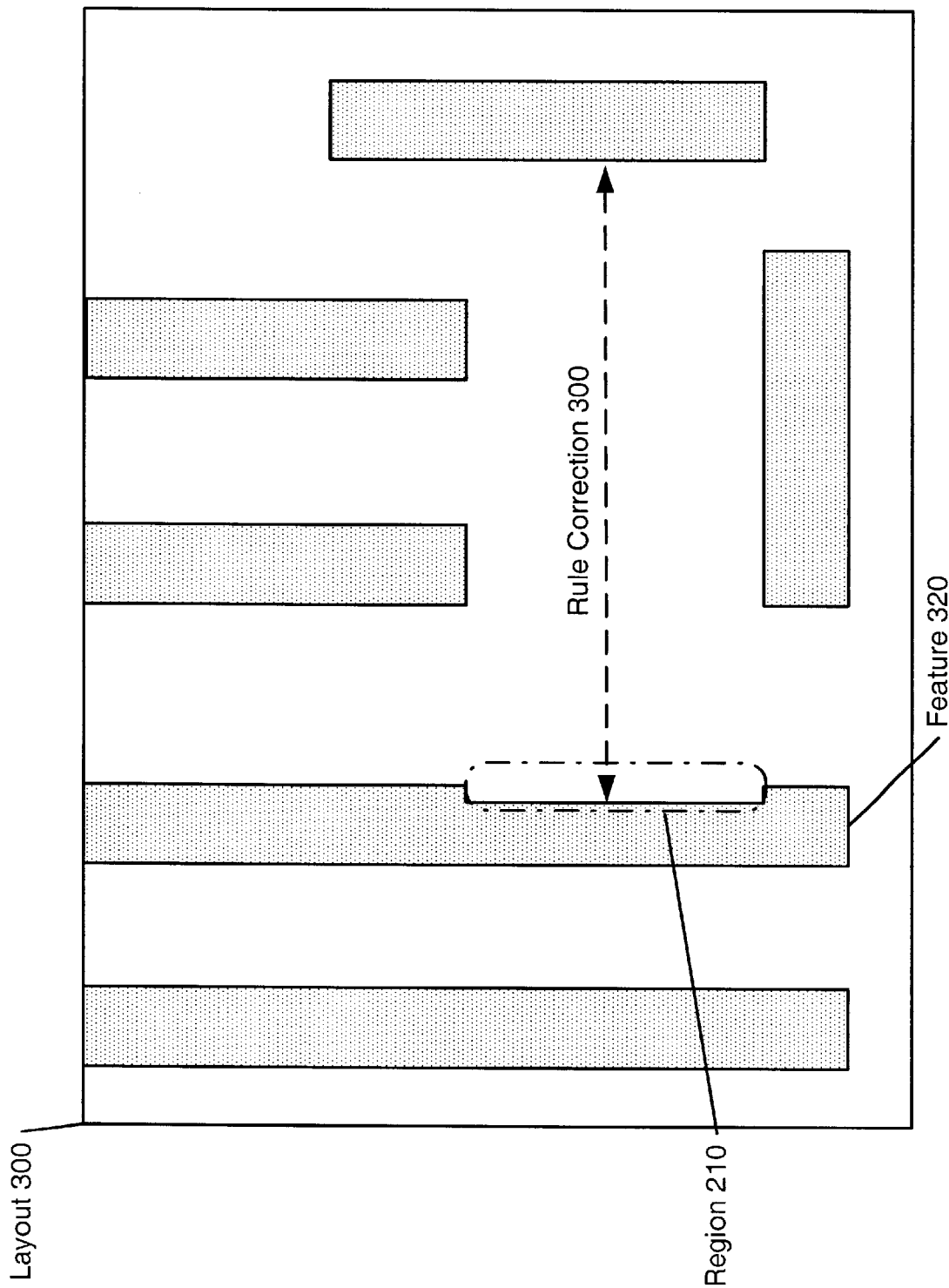
FIG. 3 depicts rules based OPC correction of a portion of the layout of FIG. 2 for microloading effects.

After grouping, the process continues at step 140 with rule based OPC being applied to account for etch effects on group B edges. The OPC etch rules 110 can be used as the rules to modify the group B (separation>n μm) edge segments. The generation of the OPC etch rules 110 will be discussed in greater detail in relation to the process of FIG. 5, below. Turning to the example layout of FIG. 2, the region 210 is in group B and should be corrected for etch effects. Here, FIG. 3 shows a layout 300 that corresponds to the layout 200 after rules based correction of step 140 has been applied for the feature 220. The rule correction 310 caused the width of the feature in the region 210 to be made smaller (e.g. downward biased, narrowed, reduced in width, etc.) to account for the microloading effect. This correction reduces the width of the feature 320 in that region because semi-isolated and isolated edge segments are likely to etch more slowly and thus be too large in size. (Note: The downward bias is exaggerated for illustrative purposes in FIG. 3. For example, the downward bias might be 30 nm for a 150 nm target critical dimension. The specific bias will have to be determined for each process technology and model.)

Next, at step 150, model based OPC is applied to model the resist and optical effects on all edge segments, e.g. both group A and group B. A calibrated optical model 120 can be used to describe those effects and the final OPC layout 160 can be generated. The generation of such an optical model is described in greater detail with reference to FIG. 6.

In some embodiments, the model based OPC uses the modified shapes generated at step 140 as the ideal (or target) shape. Thus returning to performing this process on the layout 200, at step 150, the ideal shape for the feature 220 will be the shape of the feature 320 generated at step 140 during correction for microloading effects.

Figure 4:
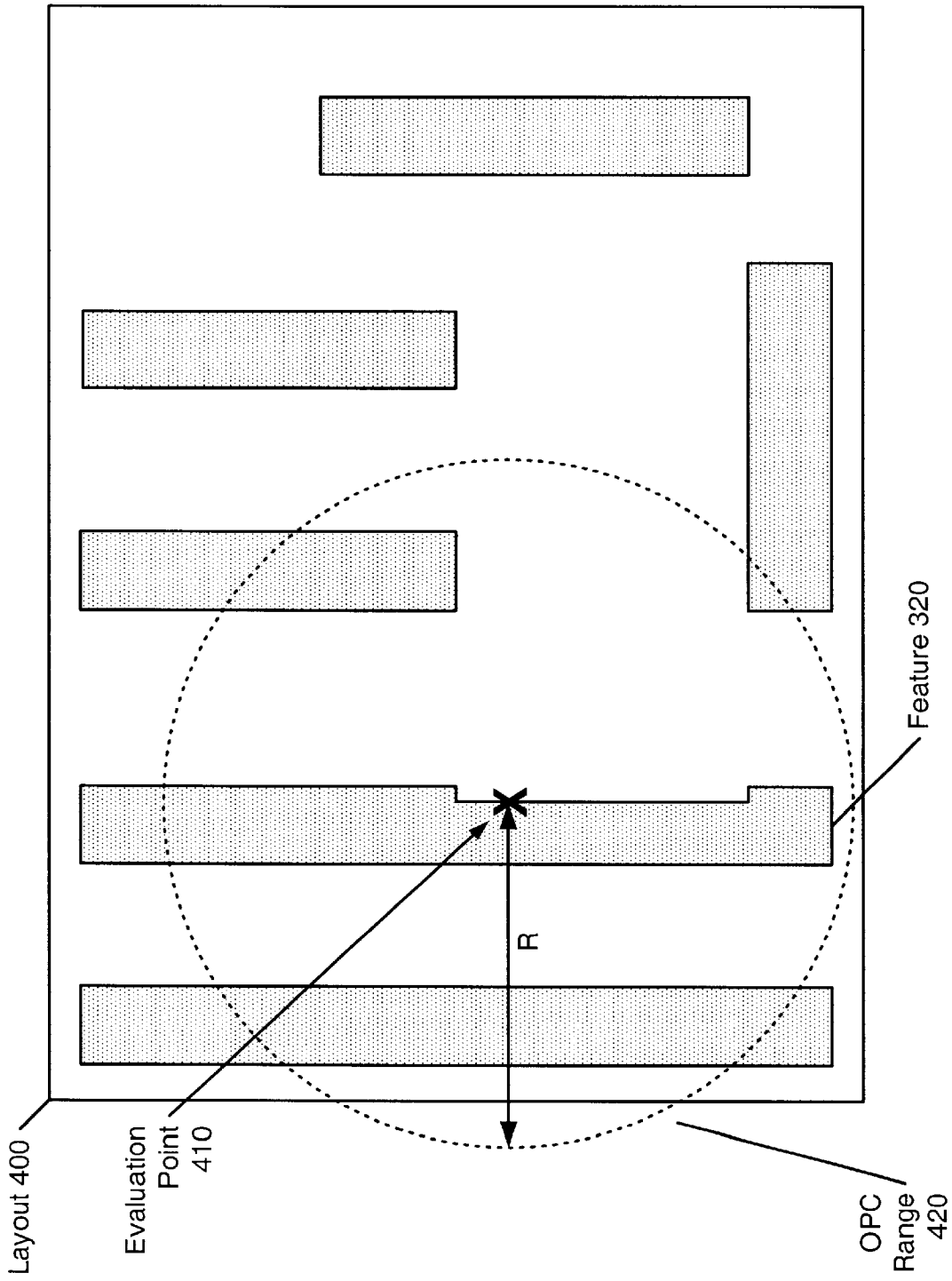
FIG. 4 depicts the model based OPC range for the layout of FIG. 3 for use in performing optical proximity correction for optical and resist effects.

FIG. 4 depicts the model based OPC range for the layout of FIG. 3 for use in performing optical proximity correction for optical and resist effects. Here, the layout 400 includes the feature 320, the ideal shape that model OPC will attempt to correct the layout to generate. An evaluation point 410 on the ideal layout is shown with an "X". A dashed line shows the OPC range 420, which is a circle of radius R from the evaluation point 410.

After the model based OPC is applied at step 150, the OPC layout 160 can be output (not shown). In some circumstances, there may be additional or intermediate steps added to the process of FIG. 1 to permit viewing, simulation, and/or testing of the intermediate and final output layouts.

In one embodiment, the process of FIG. 1 is added to an OPC software package such as the Photolynx(™) software from Transcription Enterprises, a Numerical Technologies Company, from San Jose, Calif.

Etch Model and Rule Generation

Figure 5:
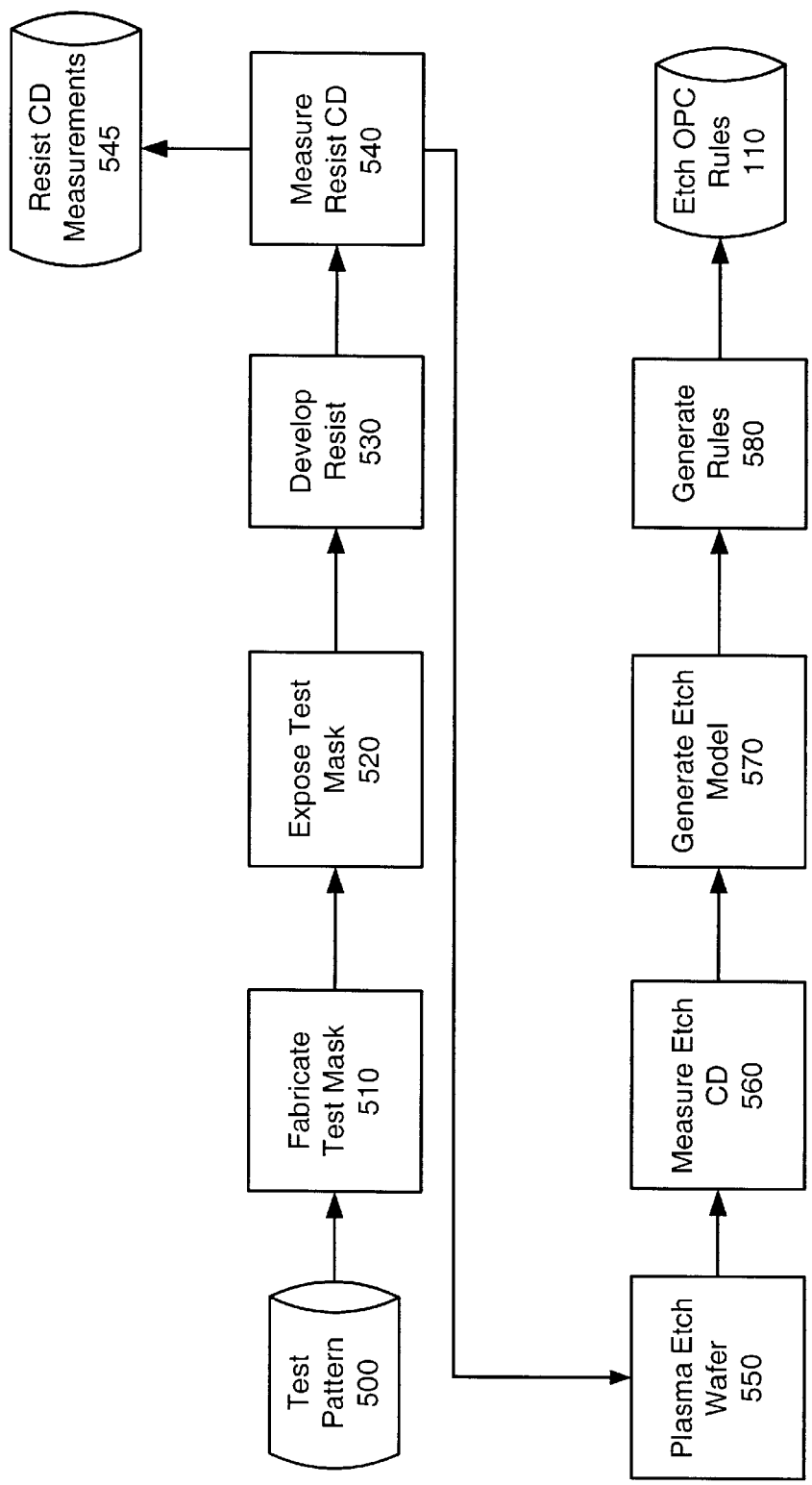
FIG. 5 is a process flow diagram for generating OPC rules based on a calibrated etching model.

FIG. 5 is a process flow diagram for generating OPC rules based on a calibrated etching model. This process can be used to generate the OPC etch rules 110 for use at step 140 of the process of FIG. 1. The generated rules will provide rule-based OPC correction for certain types of microloading effects.

The process starts with a test pattern 500. The test pattern is characterized by a number of line segments of differing widths at different separations. For example, the test pattern might include features with a critical dimension of 1 μm spaced at varying densities, e.g. minimum design pitch up through 10 μm. This could be repeated for each different critical dimension size being used in a particular layout and perhaps at differing orientations, e.g. some placed horizontally and other vertically. At step 510, a test mask is fabricated according to the test pattern.

Then, at step 520, a wafer is exposed using the test mask and the resist on the wafe developed, step 530. Next, at step 540, the critical dimension (CD) of features in the resist are measured, and stored as resist CD measurements 545. The resist CD measurements 545 can be used to calibrate optical models, for more information on that see below.

According to one embodiment, only resist CD measurements for separations less than a predetermined distance n, e.g. <1.5 μm, are stored in the resist CD measurements while only the resist CD measurements for separations greater than (or equal to) the predetermined distance are used for the remaining steps of the process of FIG. 5. For the remainder of the discussion of FIG. 5 and FIG. 6 it will be assumed that this "grouping" of resist CD measurements has occurred and that the resist CD measurement 545 contains only the measurements for separations less than the predetermined amount and that the processing at step 550–580 uses only measurements for separations greater than (or equal to) the predetermined amount. Here, the predetermined separation is 1.5 μm.

The process continues at step 550, with the etching of the wafer, e.g. plasma etch. At step, 560 the critical dimensions of features after etch are measured. These measurements are used to develop an etch model 570. The etch model predicts the variability of critical dimension for >1.5 μm separations.

Finally, from the etch model, at step 580 OPC rules are generated and stored, e.g. as OPC etch rules 110. The etch rules can take the form of specific (or ranged) data for target critical dimension and edge separation, e.g. for critical dimension target of 150 nm and a feature separation of (1.5 μm, 2 μm], the feature should be downward biased by 30 nm.

In some embodiments, the ModelGen and RuleGen software products from Numerical Technologies, Inc., of San Jose, Calif., can be used at step 570 and step 580, respectively, of the process of FIG. 5.

Process Model

Figure 6:
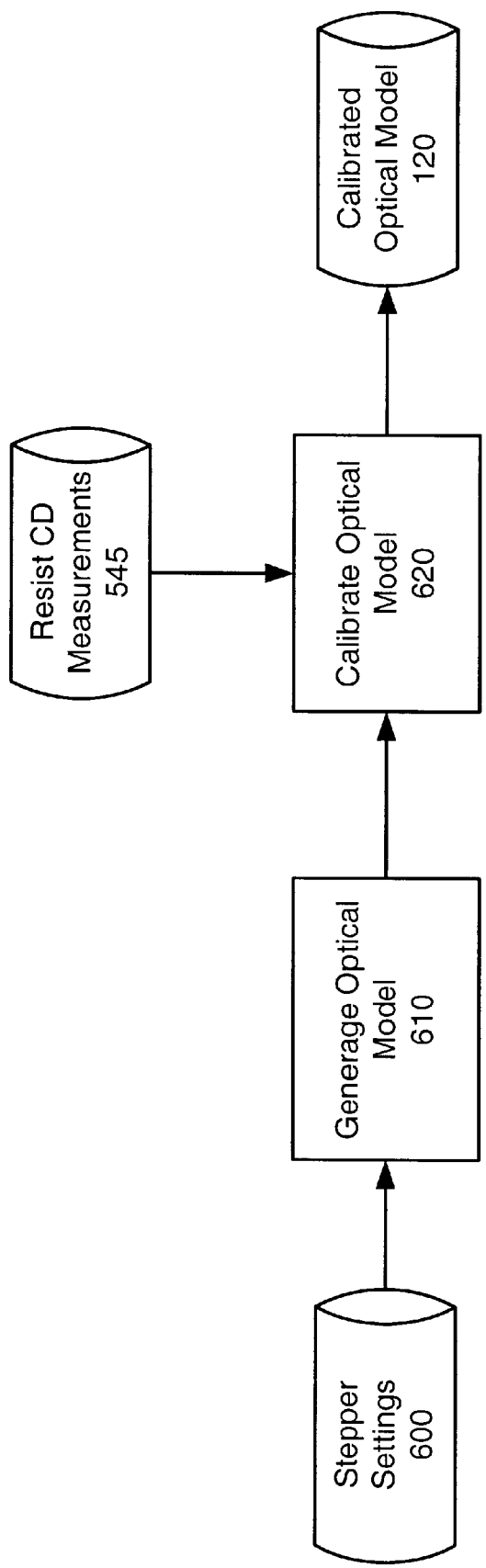
FIG. 6 is a process flow diagram for generating a calibrated model for a given lithography process.

FIG. 6 is a process flow diagram for generating a calibrated model for a given lithography process. This process can be used to generate the calibrated optical model 120 for use at step 150 of the process of FIG. 1.

The process starts with input of stepper, and other process, settings 600. This information is used to generate an optical model at step 610. For example, the ModelGen(™) software from Numerical Technologies, Inc., San Jose, Calif., could be used to generate the model. At step 620, the model can be calibrated based on results from a sample exposure, e.g. the resist CD measurements 545. As noted above, the resist CD measurements 545 may in some instances only contain measurements for feature separations less than a predetermined amount. In some embodiments, the ModelCal(™) software from Numerical Technologies, Inc., is used to generate the calibrated model. The calibrated model can be stored as the calibrated optical model 120.

Alternative Embodiments

Embodiments of the invention can be used with deep ultraviolet (DUV), extreme ultraviolet (EUV), x-ray, and/or other lithography techniques. The particular mask substrate and protective areas should be adapted for the specific lithographic process. Additionally, the rules (or simulation) will be based on the model of the specific systems being used. The examples herein and the n given for separation were for an exemplary λ=248 nm process.

Note also that at either stage of the process of FIG. 1, rule based correction could be substituted for model based correction and vice versa. The particular arrangement was selected for speed and overall accuracy. Similarly, the ordering of the correction for etch effects and optical effects can be swapped in some embodiments of the invention. This is somewhat less desirable however since by performing the optical correction second it is possible to use the ideal target shape computed earlier for the etch effects, which in terms of wafer processing come later.

Note also that the value of n used for grouping at step 130 may to some extent be empirically determined. Specifically factors such as the wavelength of the light used (λ), the numerical aperture (N.A.), the resist used, and more.

The data structures and code described in this detailed description can be stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated).

For example, the transmission medium may include a communications network, such as the Internet. In one embodiment, the computer readable storage medium includes one or more computer programs for performing rules based optical proximity correction for microloading effects, model based optical proximity correction for optical and resist effects, and grouping edges of features according to separation from surrounding features. In one embodiment, the electromagnetic waveform comprises computer programs accessed over a network, the computer programs for rules based optical proximity correction for microloading effects, model based optical proximity correction for optical and resist effects, and grouping edges of features according to separation from surrounding features.

In one variation of this embodiment, the computer data for layouts is formatted as one or more GDS-II data files. In other embodiments, the electromagnetic waveform includes a computer program accessed across the network for modifying the layout to correct for microloading effects and/or for optical and resist effects.

The foregoing description of embodiments of the invention has been provided for the purposes of illustration and description. It is not intended to be exhaustive or to limit the invention to the precise form disclosed. Many modifications and variations will be apparent. The embodiments were chosen and described in order to best explain the principles of the invention and its practical application, thereby enabling others to understand the invention for various embodiments and with various modifications as are suited to the particular use contemplated. It is intended that the scope of the invention be defined by the following claims.

I claim:

1. A computer program product for optical proximity correction (OPC) of a layout for a layer of material in an integrated circuit (IC) for optical and etch effects, the computer program product comprising:
    a first set of instructions for accessing rules for etch correction and a model for optical correction;
    a second set of ins ructions for grouping features in the layout based on edge separation into a first group having a separation greater than a predetermined amount and a second group;
    a third set of instructions for performing correction on edges in the first group for etch effects;
    a fourth set of instructions for performing Correction on edges in the first group and the second group for optical effects, the fourth set of instructions using modified position of edges generated by the third set of instructions as ideal shape for corrections.

2. The computer program product of claim 1, wherein the first set of instructions further comprises at least one of:
    a fifth set of instructions to construct rules for etch correction based on critical dimension etch measurements taken from a wafer exposed to a test pattern, and
    a sixth set of instructions to generate a model for optical and resist correction based on critical dimension resist measurements taken from a wafer exposed to a test pattern.

3. The computer program product of claim 1, wherein etch effects comprise micro loading effects from variable etch rates due to different densities and sizes for features in the layout.

4. The computer program product of claim 1, wherein the layout comprises a layout describing one or more masks for defining the layer of material using phase shifting.

5. The computer program product of claim 1, wherein the layout formatted according to at least one of a GDS-II stream format, a mask electron beam exposure system (MEBES) format, a Gerber format, and an electronic design interchange format (EDIF).

6. The computer program product of claim 1, wherein the computer program product embodied in at least one of a compact disc, a digital versatile disc (DVD), and a hard drive.

7. A method for performing optical proximity correction (OPC) of a layout for a layer of material in an integrated circuit (IC) for optical and etch effects, the method comprising:

modifying the layout using a first correction process for etch effects; and modifying the layout using a second correction process for optical effects, the second correction using the layout generated by the first correction process as ideal shape for corrections, wherein the first correction process corn rises a rule based correction and the second correction process comprises a model based correction process.

8. The method of claim 7, wherein the layout comprised of a plurality of edges, the plurality of edges forming a plurality of features, and wherein the modifying the layout using a first correction process further comprises applying the first correct ion process only to edges having a feature separation over a predetermined amount, n, from edges of other features in the layout.

9. The method of claim 8, wherein n comprises 1.5 $\mu$m.

10. The method of claim 7, wherein etch effects comprise micro loading effects from variable etch rates due to different densities and sizes for features in the layout.

11. The method of claim 7, wherein optical effects comprise optical and resist effects from optical properties and resist properties of lithography system.

12. An apparatus for optical proximity correction (OPC) of a layout for a layer of material in an integrated circuit (IC) for optical and etch effects, the apparatus comprising:

a first means for correcting the layout for etch effects; and a second means for correcting the layout for optical effects using the layout generated by the first means as ideal shape for corrections, wherein the first means further comprises a means for performing rule based correction for etch effects and the second means further comprises means for model based correction for optical effects.

13. The apparatus of claim 12, wherein the layout comprised of a plurality of edges, the plurality of edges forming a plurality of features, and wherein the first means further comprises means for correcting only edges having a feature separation over a predetermined amount, n, from edges of other features in the layout.

14. The apparatus of claim 13, wherein n comprises 1.5 $\mu$m.

15. The apparatus of claim 12, wherein etch effects comprise micro loading effects from variable etch rates due to different densities and sizes for features in the layout.

16. The apparatus of claim 12, wherein optical effects comprise optical and resist effects from optical properties and resist properties of lithography system.

* * * * *

UNITED STATES PATENT AND TRADEMARK OFFICE
CERTIFICATE OF CORRECTION

PATENT NO.    : 6,684,382 B2
DATED         : January 27, 2004
INVENTOR(S)   : Liu It is certified that error appears in the above-identified patent and that said Letters Patent is hereby corrected as shown below:

Column 6,
Line 41, "a second set of ins ructions" is replaced with -- a second set of instructions --
Line 47, "a fourth set of instructions for performing Correction" is replaced with
-- a fourth set of instructions for performing correction --

Column 7,
Line 21, "wherein the first correction process corn rises a rule based"
is replaced with -- wherein the first correction process comprises a rule based --
Line 28, "the first correct ion process" is replaced with -- the first correction process --

Signed and Sealed this

Twenty-ninth Day of June, 2004

JON W. DUDAS
*Acting Director of the United States Patent and Trademark Office*